Nov. 29, 1966 E. W. FARMER ETAL 3,289,124

SWEEP SYSTEM

Filed May 29, 1963 2 Sheets-Sheet 1

INVENTORS
EVERETT W. FARMER
FRANK A. BELLUCCI,
MICHAEL DINOLFO
BY
ATTORNEY

INVENTOR.
EVERETT W. FARMER
FRANK A. BELLUCCI
MICHAEL DINOLFO
BY
ATTORNEY 3,289,124
Patented Nov. 29, 1966

3,289,124

SWEEP SYSTEM

Everett W. Farmer, Merrimack, and Frank A. Bellucci and Michael Dinolfo, Nashua, N.H., assignors to Sanders Associates, Inc., Nashua, N.H., a corporation of Delaware Filed May 29, 1963, Ser. No. 284,213
13 Claims. (Cl. 334—22)

The present invention relates to a sweep system and more particularly to an electromechanical system for automatically and rapidly sweeping a receiver through its entire frequency range in a series of fine and coarse frequency steps.

There has been increasing demand for a system to automatically sweep a receiver through its entire frequency spectrum. Such a system is desirable, for example, for surveillance of a band of frequencies to ascertain whether signals are being broadcast at any frequencies with the band. In some situations, it has been necessary to manually sweep the receiver through its frequency range, pausing at each frequency channel to determine if a transmitter is broadcasting at that frequency. Another alternative would be to provide a plurality of receivers tuned to different frequencies at which radio transmissions might be expected. The disadvantages of these techniques are quite apparent.

Certain purely electronic systems have been developed for automatically tuning a receiver by means of voltage-variable capacitors in the tuning circuits. In such systems, the resonant frequency of a tuning circuit is varied by varying the voltage across the tuning capacitor. This system suffers from the disadvantage that the frequency range of a tuning circuit employing one of these capacitors is rather limited, and, in order to cover the entire tuning range of the receiver, a rather complex tuning system utilizing a plurality of these voltage variable capacitors in separate tuning circuits is necessary.

It is therefore an object of the present invention is to provide an improved system for rapidly sweeping a receiver through its entire frequency spectrum.

An additional object is to provide an automatic sweep system being capable of operating through a large frequency band.

A further object of the invention is to provide an automatic sweep system which is adaptable to existing receiver units with only slight modification.

An additional object is to provide a sweep system which is small and compact, and which can be installed as a modular unit on existing receiver units.

A still further object is to provide a sweep system which can be readily and rapidly converted to various modes of operation.

Other objects of the invention will in part be obvious and will part appear hereinafter.

The invention accordingly comprises the features of construction, combination of elements and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

Briefly, the invention operates with a receiver that has coarse and fine frequency controls. Assuming that these controls are operated by the rotation of shafts, motors are coupled to the shafts by electrically controlled clutches. The clutches are periodically engaged to rotate the shafts in discrete increments. The increment of rotation of the coarse tuning shaft corresponds to the sum of the increments of the fine tuning shaft between the limits of rotation thereof. That is, the frequency change due to a single increment of coarse shaft rotation equals the entire fine tuning range. Thus, in a well known manner, any frequency channel within the tuning range of the receiver can be covered by a combination of coarse and fine shaft positions.

In considering the mode of operation of the system, assume that both the coarse and fine tuning shafts are at their low frequency limits. The fine tuning shaft is then indexed increment-by-increment, until it reaches its upper frequency limit, i.e., at the upper end of the first, or lowest, coarse frequency increment. The coarse tuning shaft is then indexed upwardly by one increment, and as a result, the receiver is tuned to the upper end of the second coarse frequency increment. The direction of the fine tuning shaft is then reversed, and the receiver is gradually tuned downward through the second coarse increment.

When the fine tuning shaft returns to its low frequency limit of rotation, the second coarse frequency increment has been covered. The coarse tuning shaft then indexes upwardly by one increment, and the fine tuning shaft reverses direction to tune upwardly through the third coarse frequency increment.

Thus, each time the fine tuning shaft reachces a limit of rotation, the coarse tuning shaft indexes one increment and the fine tuning shaft reverses rotation. In this manner, the receiver progresses to its upper frequency limit. It may follow a similar sequence in returning to the low frequency end of its range.

Figure 1:
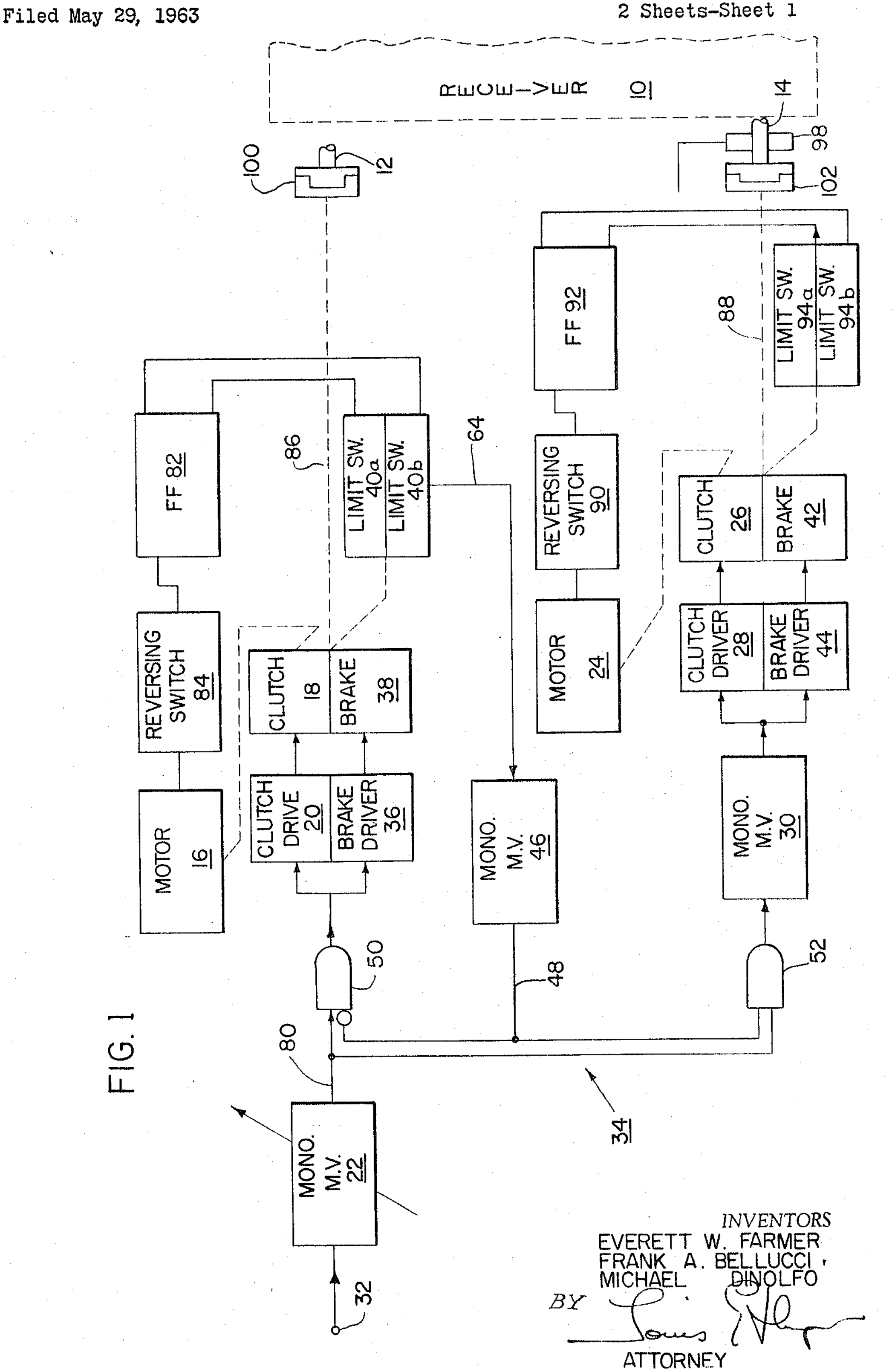
FIG. 1 is a block diagram of an embodiment of the present invention.

Referring generally to FIG. 1, a receiver 10 is provided with a fine frequency tuning shaft 12 and a coarse tuning shaft 14. A constant speed motor 16 rotates the fine tuning shaft in discrete steps between its limits of rotation through intermittent engagement of a clutch 18 connected between the motor and shaft. Operation of the clutch is electrically controlled by an electromagnetic clutch driver 20 which is energized by a monostable multivibrator 22.

Similarly, the coarse tuning shaft 14 is connected to a motor 24 by a clutch 26. The clutch 26, in turn, is actuated by a clutch driver 28 which is energized by a monostable multivibrator 30.

The clutches 18 and 26 are normally disengaged, so that the shafts 12 and 14 are rotated by the motors 16 and 24 only when the respective clutch drivers are energized. The uniform output pulses of the multivibrator 22 have a time duration corresponding to the desired engagement time of the clutch 18 and also the frequency increment of each fine frequency step. Likewise, the uniform output pulses of the multivibrator 30 result in uniform coarse frequency increments.

The multivibrator 22 is triggered by clock pulses from a suitable source (not shown) connected to an input terminal 32. The resulting output pulses from this multivibrator are normally applied to the clutch driver 20 through a steering gate generally indicated at 34, and thus the shaft 12 is rotated through a succession of small angular increments. The multivibrator pulses are also applied to a brake driver 36 to release a brake 38 which is preferably included in the system to lock the shaft 12 when the clutch 18 is disengaged.

When the shaft 12 reaches its desired limit of rotation, it actuates an upper limit switch 40*a* or a lower limit switch 40*b*, depending on whether the upper or lower end of the fine tuning range has been reached. This results in momentary operation of the steering gate 34 to switch the next output pulse of the multivibrator 22 to the input of the multivibrator 30. The single resulting output pulse of the multivibrator 30 causes rotation of the coarse tuning shaft through one angular increment thereof. The coarse tuning unit preferably includes a brake 42 and brake driver 44 similar to those in the fine tuning unit.

The succeeding output pulses of the multivibrator 22 are again steered to the clutch driver 20, but by this time actuation of the limit switch 40*a* or 40*b* has caused reversal of rotation of the motor 16. Accordingly, the fine tuning shaft 12 is rotated through a succession of angular increments in the opposite direction from the previous series of such increments. When the shaft 12 reaches the limit of rotation in this direction, the same sequence takes place as at the other limit of rotation. That is, the coarse tuning shaft 14 is advanced a single increment and the direction of the motor 16 is reversed, whereupon the shaft 12 retraces its steps through the fine tuning range.

Figure 4:
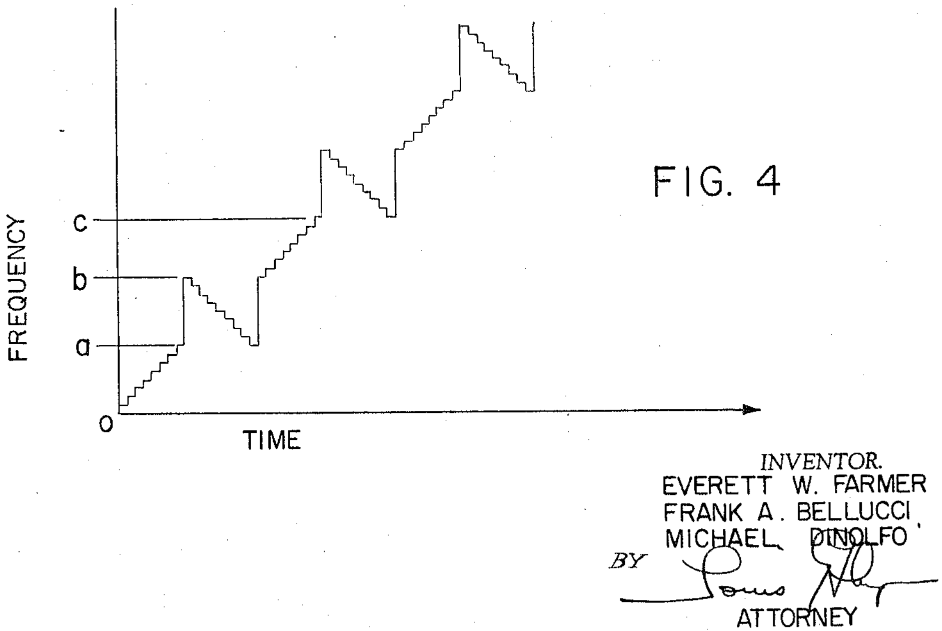
FIG. 4 is a graphical illustration of the preferred mode of operation of the invention.

FIG. 4 graphically depicts the resulting pattern described by the receiver 10 in covering its entire tuning range. The coarse frequency increments are the long almost vertical lines and the fine frequency increments are the short almost vertical lines. Initially, both the fine and coarse tuning shafts 12 and 14 (FIG. 1) are at their low frequency limits. At the beginning of the frequency scan, the frequency is increased in fine increments until the upper limit of the fine tuning range is reached and the receiver is tuned to the frequency *a*. Then, in the manner described above, the coarse tuning shaft 14 is indexed one increment to bring the receiver 10 from frequency *a* to frequency *b*, this increment equalling the fine tuning range. With the reversal of the motor 16 (FIG. 1), the fine tuning shaft is indexed downward in frequency to its lower frequency limit, at which point the receiver is tuned to the frequency *a*.

The coarse tuning shaft is then again indexed upwardly in frequency by one increment to shift the receiver to frequency *b*, and with reversal of the motor 16, the receiver advances in fine frequency increments from frequency *b* to *c*. Thus, successive coarse frequency increments are covered by the fine tuning system, though the fine tuning goes upward in frequency and then downward in alternate coarse increments. In this manner, the upper frequency limit of the receiver 10 is reached, with both the coarse and fine tuning shafts at their higher frequency limits.

In a manner to be described, the tuning procedure is then reversed. The fine tuning shaft 12 is reversed to tune the receiver downward in frequency and when the shaft 12 reaches its lower limit, the coarse tuning shaft 14 is indexed by an amount corresponding to a downward shift in frequency by a single coarse frequency increment. Operation then continues as in the case of upward tuning of the receiver, except that the coarse tuning shaft is continually indexed in the downward direction, until the low frequency limit of the receiver 10 is reached. The receiver then automatically reverses direction and once again progresses upwardly in frequency.

Returning to FIG. 1, the steering gate 34 includes a monostable multivibrator 46 whose output is fed over a line 48 to gates 50 and 52 interposed between the multivibrator 22 and the respective clutch and brake drivers 20 and 36 and multivibrator 30. In its quiescent, or stable, state the multivibrator 46 enables the gate 50 and disables the gate 52; in its triggered, or unstable, state it disables the gate 50 and enables the gate 52. The multivibrator 46 is triggered by actuation of either of the limit switches 40*a* or 40*b* and, when so triggered, it remains in its unstable state long enough to permit a single pulse from the multivibrator 22 to be passed by the gate 52 to the multivibrator 30. As noted above, this occurs at each end of the fine tuning range, with a resulting indexing of the shaft 14 for a single coarse frequency increment.

Figure 2:
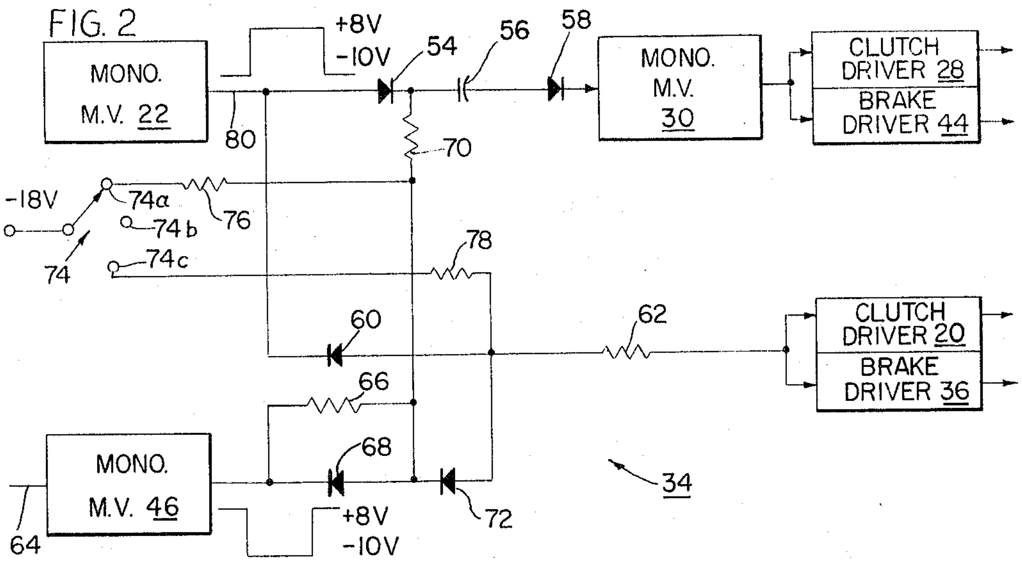
FIG. 2 is a circuit diagram of a pulse steering gate which is utilized in FIG. 1, and FIG. 3 discloses a modification of a portion of the circuit of FIG. 1 which is resorted to in situations where it is found that non-linearity exists in the coarse frequency tuning unit.

The steering gate 34 is shown in detail in FIG. 2. As shown therein, each clock pulse received at terminal 32 triggers the multivibrator 22 to produce an output pulse which goes from −10 to +8 volts. This positive-going pulse may pass to the coarse frequency monostable multivibrator 30 through a gate diode 54, a coupling capacitor 56 and a diode 58. Alternatively, the pulse may be communicated to the fine frequency clutch and brake drivers 20 and 36 through a gate diode 60 and resistor 62.

The multivibrator 46, triggered over line 64 by actuation of either the upper or lower fine frequency limit switches 40*a* or 40*b* in FIG. 1, provides an output pulse which goes from +8 to −10 volts, as shown. This negative-going pulse is applied to the cathode of diode 54 through the parallel combination of a resistor 66 and a diode 68, in series with a resistor 70. In addition, this pulse is applied to the anode of diode 60 through the same parallel combination, in series with a diode 72.

A −18-volt potential is coupled to the contact arm of a selector switch 74 having output terminals 74*a*, 74*b* and 74*c*. Output terminal 74*a* is connected to the lower end of resistor 70 through a resistor 76. Switch terminal 74*c* is coupled to the anodes of diodes 60 and 72 through a resistor 78. The selector switch 74 is utilized to control the mode of operation of the system of FIG. 1, as will become clear hereinafter.

In considering the operation of the steering gate of FIG. 2, assume that the contact arm of selector switch 74 is positioned on the blank output terminal 74*b*. The positive-going output pulse from multivibrator 22 appearing on line 80 is communicated to the clutch driver 20 and the brake driver 36 through diode 60 and resistor 62 by causing the anode of diode 60 to rise from −10 volts to +8 volts. With the multivibrator 46 in its quiescent state, it applies a +8 volt reverse bias to the cathode of diode 54 through resistors 66 and 70, and this inhibits passage of the positive-going pulse on line 80 through diode 54 to the coarse frequency multivibrator 30.

Pulsing of the fine frequency driver circuit continues, whereupon one or the other of the limit switches 40*a* and 40*b* is tripped, producing an output on line 64 to trigger the multivibrator 46. The single negative-going output pulse from the multivibrator 46 is passed through diode 68 and diode 72 to reverse bias the anode of diode 60. In addition, this pulse is coupled to the cathode of diode 54 through diode 68 and resistor 70. The diode 54 is forward biased, and the diode 60 is reverse biased, and, as a result, the next occurring output pulse on line 80 is passed through diode 54 to trigger multivibrator 30, resulting in rotation of the coarse tuning shaft. Upon termination of the negative-going output pulse from multivibrator 46, diode 54 is once again inhibited, while diode 60 is enabled, thereby coupling the positive-going pulses on line 80 to the fine tuning drivers.

With further reference to FIG. 2, when the contact arm of selector switch 74 is on terminal 74*a*, a −18 volt potential is applied through resistors 76 and 70 to the cathode of diode 54, and through resistor 76 and diode 72 to the anode 60. The diode 54 is thus forward biased, while diode 60 is reverse biased, and all of the multivibrator output pulses on line 80 are coupled to the coarse frequency monostable multivibrator 30, resulting in repetitive coarse frequency stepping.

If it is desired to disable the sweep system, thereby permitting manual operation of the frequency tuning shafts 12 and 14 within the receiver, the contact arm of selector switch 74 is positioned on terminal 74*c*. The −18 volt potential is then applied through resistor 78 to the anode of diode 60 to inhibit passage of the positive-point output pulses on line 80 to the fine frequency driver circuits. Since the fine tuning shaft 12 of FIG. 1 is not being stepped, the delay multivibrator 46 will not be triggered, and, as a result, the quiescent state output voltage of this multivibrator continuously back biases diode 54 through resistors 66 and 70.

Returning to FIG. 1, the reversal of the motor 16 at each end of the fine tuning range is accomplished by means of a flip-flop 82. The flip-flop actuates a reversing switch 84, connected to the motor, in response to actuation of the limit switches 40*a* and 40*b*. Specifically, the switch 84 may be a conventional electromagnetic relay having a coil which is energized when the flip-flop 82 is in one of its states and de-energized when the flip-flop is in the other state. The state of the flip-flop 82 depends on which of the switches 40*a* and 40*b* has more recently been tripped by a control shaft 86 which couples the tuning shaft 12 to the clutch 18. Thus, the flip-flop reverses its state at each end of the fine tuning range, with consequent operation of the switch 84 and reversal of the motor 16.

Similarly, reversal of the motor 24 powering the coarse tuning shaft 14 by way of a control shaft 88 is effected by a reversing switch 90 controlled by a flip-flop 92. The flip-flop, in turn, is conditioned by upper and lower limit switches 94*a* and 94*b* tripped by the shaft 88. Thus, the motor 24 reverses direction at each end of the entire tuning range of the receiver 10.

Figure 3:
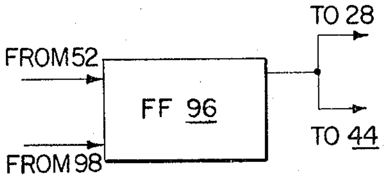

A modification of FIGS. 1 and 2 illustrated in FIG. 3, is resorted to in situations where it is found that the frequency-to-angle relationship of the coarse tuning shaft within the receiver is non-linear. In such case, a flip-flop 96 is substituted for the monostable multivibrator 30 in FIGS. 1 and 2. Thus, flip-flop 96 is switched to the "set" position by the output pulses from multivibrator 22 appearing on line 80 at the times when multivibrator 46 is triggered by the fine tuning limit switches 40*a* and 40*b*. The flip-flop 96, while in the set condition, produces an output signal which energizes the clutch 26 and releases the brake 42 in the same manner as the multivibrator 30 in FIGS. 1 and 2. A monostable multivibrator, absent interim adjustment of its circuit parameters, produces output pulses of constant time duration. Since the amount of rotation of the coarse tuning shaft 14 depends on the time duration of each of these output pulses, this shaft will be rotated in equal increments on the occurrence of each multivibrator output pulse. In situations where the frequency-to-revolution ratio of the coarse frequency tuning shaft within the receiver is nonlinear, constant incremental rotations of the shaft will result in erroneous frequency settings of the receiver tuning shaft 14.

To rectify this problem, the receiver is provided with a plurality of microswitches 98 (FIG. 1) so positioned that, as the coarse tuning shaft 14 arrives at each of its settings, one of these microswitches is activated to provide a "reset" input to the flip-flop 98 of FIG. 3. This reset input terminates the output signal from flip-flop 98, thereby terminating the rotation of shaft 14 at a point corresponding to the correct position thereof. This action all takes place during the period that the gate 50 is disabled and the fine tuning shaft 12 is stationary.

In another case, a specially machined cam with a minimum number of microswitches will accomplish the above described function.

It will be noted that the present invention may be readily adapted to existing receivers. The control shafts 86 and 88 are merely mechanical coupled to the fine and coarse tuning shafts 12 and 14 in the receiver by couplings 100 and 102. Then, upon adjustment of the various monostable multivibrators to achieve the desired output pulse durations, sweep operation may be initiated. If it is found necessary to resort to the modification of FIG. 3, the microswitches 98 may be readily mounted for actuation by the coupling 102 without jeopardizing the operation of the receiver when used apart from the present invention.

The sweep system described herein is adaptable to varying speeds of operation merely by varying the repetition rate of the clock pulses applied to the input terminal 32 (FIG. 1). The only limitation on the speed of operation is the time required for the various clutches and brakes to operate and the time required for the motors 16 and 24 to reverse direction and come up to speed.

The extent of each fine frequency incremental step may be readily varied by varying the output pulse duration of monostable multivibrator 22. This in turn changes the number of fine frequency increments within each coarse increment. In general, this is easily accomplished by adjusting the time constant of an R–C circuit within the multivibrator. Another factor to consider is that, as the pulse duration of the multivibrator is reduced, the surveillance time at each fine frequency setting is increased, assuming the clock pulse rate.

It is contemplated that the present invention may be operated in combination with a printer. The printer, under the control of the receiver, will print out a designation for each setting of the fine tuning shaft and indicate whether or not transmissions are received at that particular frequency. In addition, the clock pulses may be applied to input terminal 32 through a gating circuit so that, upon reception of transmissions at any particular frequency setting, a signal will be generated to inhibit further application of these clock pulses. The receiver will then remain at that frequency setting to continue monitoring the transmissions.

The present invention has particular value in remote control applications and, although disclosed in combination with a receiver, can be used to tune generators and transmitters as well.

The invention thus provides a system for automatically and rapidly sweeping a receiver through its entire frequency spectrum. This is accomplished in novel fashion by sweeping the receiver upwardly in frequency through a first fine frequency range, then stepping the coarse tuning shaft of the receiver to a second fine frequency range and reversing the direction of sweep, and sweeping the receiver downwardly in frequency to the lower limit of the second fine frequency range. This operation is continued in cyclic fashion until the upper limit of the frequency spectrum is reached, whereupon the coarse tuning shaft is stepped in the reverse direction and the frequency spectrum of the receiver is scanned downwardly to the lower frequency limit. Additionally, the system makes use of conventional component units capable of high speed operation with a high degree of reliability.

It will thus be seen that the objects set forth above, among those made apparent from the preceding description, are efficiently attained and, since certain changes may be made in the above system without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. A system for sweeping a tunable device through its tuning range in at least one direction, said device having fine and coarse tuning controls, said system comprising (a) first means for tuning said device by movement of said fine and coarse tuning controls, (b) said first means being operable to move said fine tuning control in a first direction through a first fine tuning range in a series of fine tuning steps, (c) second means responsive to the movement of said fine tuning control for rendering said first means effective to interrupt movement of said fine tuning control and to move said coarse tuning control through a single coarse tuning increment in said one direction, equal to said series of fine tuning steps, (d) third means included in said second means for causing said first means to move said fine tuning control in a second direction through a second fine tuning range in a series of discrete fine tuning steps, (e) said second means being responsive to the movement of said fine tuning control in said second direction to interrupt movement of said fine tuning control and to cause said first means to move said coarse tuning control through a second coarse tuning increment in said one direction equal to said first coarse tuning increment, (f) said third means again being operable to cause said first means to move said fine tuning control in said first direction through a third fine tuning range in a series of discrete fine tuning steps, and (g) said second means being further operable in response to movement of said fine tuning control to control said first means in a manner to move said fine tuning control alternately in one said direction and then the other direction through succeeding fine tuning ranges and to move said coarse tuning control one coarse tuning increment in said one direction between alternations in the direction of movement of said fine tuning control thereby sweeping said device through the tuning range of said device.

2. The system claimed in claim 1 which further includes means responsive to the movement of the coarse tuning control upon reaching the limits of the tuning range of said device for causing said first means to effect subsequent movement of said coarse tuning control in a direction opposite to said one direction.

3. A system for automatically sweeping a receiver through a frequency range in one direction, said receiver having fine and coarse tuning shafts, said system comprising (a) means for rotating said fine and coarse tuning shafts, (b) a first electronic circuit means for rendering said rotating means effective to rotate said fine tuning shaft in repetitive fine tuning increments in a first direction through a fine tuning range, (c) limit means responsive to the rotation of said fine tuning shaft to the limits of rotation thereof for causing said rotating means to rotate said fine tuning shaft in a second direction, (d) second electronic circuit means responsive to said rotation of said fine tuning shaft to the limits of rotation thereof for rendering said rotating means effective to index said coarse tuning shaft through a single coarse tuning increment, (e) said first electronic circuit means rendering said rotating means effective to interrupt rotation of said fine tuning shaft during indexing of said coarse tuning shaft, and (f) said second circuit means indexing said coarse tuning shaft in the same direction throughout said frequency range.

4. The system defined in claim 3 wherein said limit means includes (a) at least one limit switch mechanically coupled to said fine tuning shaft and actuated when said fine tuning shaft reaches its limits of rotation, and (b) switching means operable in response to actuation of said limit switch for causing said rotating means to rotate said fine tuning shaft in a second direction.

5. The system defined in claim 4 wherein said rotating means includes (a) a first synchronous motor coupled to said fine tuning shaft, and (b) a second synchronous motor coupled to said coarse tuning shaft.

6. A system for automatically sweeping the frequency spectrum of a receiver, said receiver having fine and coarse rotatable tuning shafts, said system comprising (a) first driving means coupled to said fine tuning shaft, (b) second driving means coupled to said coarse tuning shaft, (c) first drive circuit means for rendering said first driving means effective to rotate said fine tuning shaft, (d) second drive circuit means for rendering said second driving means effective to rotate said coarse tuning shaft, (e) an electronic steering gate normally directing energization pulses to said first drive circuit means to effect rotation of said fine tuning shaft through a series of discrete fine frequency steps in one direction through a first fine tuning range, (f) limit means actuated by the rotation of said fine tuning shaft to its limits of rotation for causing said first driving means to reverse its direction of rotation, (g) said steering gate being responsive to said limit means to direct at least one of said energization pulses to said second drive circuit means to operate as a coarse stepping pulses for rendering said second driving means effective to rotate said coarse tuning shaft through a single coarse frequency increment to the next fine tuning range, (h) said coarse frequency increment being equal to the frequency spread of a single fine tuning range, (i) said steering gate directing energization pulses subsequent to said coarse stepping pulses to said first drive circuit means to rotate said fine tuning shaft in repetitive fine frequency steps through said next fine frequency range.

7. The system defined in claim 6 wherein said first driving means includes (a) a first constant speed motor, (b) a first clutch for engaging said first motor to said fine tuning shaft in response to enèrgization of said first drive circuit means, and (c) a first brake actuated by said first drive circuit means to constrain rotation of said fine tuning shaft during periods when said first clutch is disengaged.

8. The system defined in claim 7 wherein said second driving means comprises (a) a second constant speed motor, (b) a second clutch for engaging said second motor to said coarse tuning shaft in response to energization of said second drive circuit means, and (c) a second brake actuated by said first drive circuit means to constrain rotation of said coarse tuning shaft during periods when said second clutch is disengaged.

9. The system as claimed in claim 7 wherein said limit means includes (a) at least one limit switch mechanically coupled to said fine tuning shaft, and (b) switching means responsive to the actuation of said limit switch and connected to reverse the energization of said first motor when said fine tuning shaft reaches its limits of rotation.

10. The system defined in claim 9 wherein said steering gate includes (a) a first gate for coupling energization pulses to said first drive circuit means, (b) a second gate for coupling energization pulses to said second drive circuit means, (c) a trigger circuit responsive to said limit means for disabling said first gate and enabling said second gate, and (d) a selector switch for selectively applying enabling and disabling inputs to said first and second gates and overriding said trigger circuit.

11. A system for automatically sweeping the entire frequency spectrum of a receiver, said receiver having coarse and fine tuning shafts, said system comprising (a) a first driving means coupled to said fine tuning shaft, (b) a second driving means coupled to said coarse tuning shaft, (c) a first drive circuit means for actuating said first driving means, (d) a second drive circuit means for actuating said second driving means, (e) a monostable multivibrator for developing energization pulses, (f) a steering gate coupled to said monostable multivibrator for directing said energization pulses normally to said first drive circuit means so as to actuate said first driving means to effect rotation of said fine tuning shaft in a series of discrete fine frequency steps in one direction through a first fine tuning range, (g) first limit means responsive to continued rotation of said fine tuning shaft in said one direction for reversing the direction of rotating of said first driving means, (h) said steering gate being responsive to said limit means for directing at least one of said energization pulses to said second drive circuit means so as to actuate said second driving means to effect rotation of said coarse tuning shaft through a single coarse frequency increment in one direction to a second fine tuning range, (i) said first drive circuit being responsive to pulses subsequent to said one pulse directed from said steering gate circuit so as to actuate said first driving means to rotate said fine frequency tuning shaft through said second fine frequency in the direction opposite to said one direction, and (j) second limit means responsive to continued rotation of said coarse frequency tuning shaft in said one direction thereof for reversing the direction of rotation of said second driving means.

12. The system defined in claim 11 wherein said second limit means includes (a) at least one limit switch mechanically coupled to a control shaft connecting said second driving means to said coarse frequency tuning shaft and actuated thereby, and (b) switching means responsive to the actuation of said limit switch to reverse the rotation of said second driving means.

13. The system defined in claim 11 wherein said second drive circuit means includes (a) a flip-flop triggered by said energization pulses from said steering gate for generating an output signal to actuate said second drive circuit means, and (b) means responsive to the rotation of said coarse tuning shaft through each coarse frequency increment for terminating the output signal from said flip-flop.

No references cited.

ELI LIEBERMAN, *Primary Examiner.*

R. F. HUNT, *Assistant Examiner.*